(12) United States Patent
Mullgrav, Jr.

(10) Patent No.: US 6,621,349 B2
(45) Date of Patent: Sep. 16, 2003

(54) POWER SUPPLY NOISE COMPENSATION AMPLIFIER

(75) Inventor: Allan L. Mullgrav, Jr., Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/014,632

(22) Filed: Nov. 7, 2001

(65) Prior Publication Data

US 2003/0085765 A1 May 8, 2003

(51) Int. Cl.[7] .................................................. H03F 1/30
(52) U.S. Cl. ........................ 330/297; 330/149; 323/314; 326/115
(58) Field of Search ................................. 330/297, 149; 323/314; 326/115

(56) References Cited

U.S. PATENT DOCUMENTS

| | | | | |
|---|---|---|---|---|
| 4,475,215 A | | 10/1984 | Gutleber | 375/34 |
| 4,630,104 A | | 12/1986 | Nakagaki et al. | 358/36 |
| 4,912,427 A | * | 3/1990 | Rybicki | 330/149 |
| 5,831,421 A | * | 11/1998 | Taira et al. | 323/314 |
| 5,907,624 A | | 5/1999 | Takada | 381/94.2 |
| 6,052,420 A | | 4/2000 | Yeap et al. | 375/346 |
| 6,061,456 A | | 5/2000 | Andrea et al. | 381/71.6 |
| 6,107,886 A | * | 8/2000 | Kusakabe et al. | 330/297 |
| 6,297,624 B1 | * | 10/2001 | Mitsui et al. | 323/316 |
| 6,307,402 B1 | * | 10/2001 | Hedberg | 326/86 |
| 6,313,704 B1 | * | 11/2001 | Maruyama et al. | 330/259 |

* cited by examiner

*Primary Examiner*—Michael Tokar
*Assistant Examiner*—Linh V Nguyen
(74) *Attorney, Agent, or Firm*—Graham S. Jones, II; H. Daniel Schnurmann

(57) ABSTRACT

A power supply noise compensation amplifier has an input for connection to a power supply. The amplifier includes a differential amplifier circuit for providing an instantaneous amplified signal in response to power supply noise, and produces an output signal with an instantaneous opposite polarity from the power supply noise so a noise sensitive circuit connected to the noise compensation amplifier has a compensated power supply signal which enables it to produce a reduction in the amplitude of the noise signal at the output thereof. The differential amplifier circuit includes a differential pair of coupled transistor circuits including a leading transistor circuit and a lagging transistor circuit. The leading and lagging transistor circuits have source-drain circuits connected in parallel to the source-drain circuit of a constant current transistor so the leading and lagging transistor circuits must share a common current as a function of voltages on the leading node connected to the gate of the leading transistor and a lagging node connected to the gate of the lagging transistor. The leading transistor circuit includes a first FET transistor having leading node connected to both and the gate electrode thereof and a resistive circuit. The lagging transistor circuit includes a lagging FET transistor having a lagging node connected to both the gate electrode thereof and the resistive and capacitive elements, and the differential amplifier circuit includes a differential pair of coupled transistor circuits including a leading transistor circuit and a lagging transistor circuit.

20 Claims, 9 Drawing Sheets

POWER SUPPLY NOISE COMPENSATION AMPLIFIER

BACKGROUND OF THE INVENTION

1. Field of the Invention

This invention relates to electronic circuits connected to power supplies which produce noisy outputs and more particularly to circuits for reducing the noise introduced by the power supply.

2. Description of Related Art

To some degree, almost all electronic circuits are susceptible to noise on their power supply or ground input lines.

FIG. 1 shows a typical prior art system 10 including a supply voltage VDD input connected through a terminal via line 60 and line 63 to the power supply input of a typical VDD Noise Sensitive Circuit (NSC) 11. The NSC 11 is also connected by lines 66 and 64 to ground (reference potential) connection of the VDD power supply to complete to the power supply circuit connection as will be well understood by those skilled in the art. Unfortunately, the power supply voltage includes a noise signal NS which is an unwanted component included with the direct current voltage VDD. A control circuit 12 is also included in system 10. The control circuit 12 is connected to receive power from the power supply through the lines 62 and 60. The ground of the control circuit 62 is connected by lines 65 and 64 to ground (reference potential) to complete the connections to the power supply. The control circuit provides control signals on output line 52 connected to an input of the NSC 11.

The typical VDD noise sensitive circuit 11 is sensitive to an unwanted input noise signal NS which is representative of certain frequencies included with the Direct Current (DC) power supply voltage VDD on line 60 which cause an unacceptable operational problem for the NSC 11. For example, in FIG. 1, the output signal OS is shown on the output line 9 from NSC 11. Thus the output signal OS from the NSC 11 is noisy and in many applications, the noise must be substantially reduced in amplitude for the output signal OS to meet specifications.

In summary the noise NS received by control circuit 12 and noise sensitive circuit 11 has an unwanted harmful effect on the typical noise sensitive circuit 11 producing an output noise signal OS along with the output signal from circuit 11 on line 9.

FIG. 2 is a modification of the electrical schematic diagram of FIG. 1 which shows a prior art method for combating the noise sensitivity problem by adding a decoupling capacitor 15 across to the power supply to reduce the noise output signal OS' on output line 9. The capacitor 15 can filter out the noise by providing an effective short circuit for the Alternating Current (AC) component of the noise. The upper plate of the capacitor 15 is connected by line 61 to line 60 to the power supply. The lower plate of capacitor 15 is connected by line 67 via to line 64 to ground completing the power supply capacitor circuit. However, when the circuit of FIG. 2 is embodied on a small microchip the decoupling capacitor 15 can consume too much area on the surface of the small microchip.

FIG. 3 is a modification of the electrical schematic diagram of FIG. 2 which shows a prior art method in which there are dual output lines 52'/52" in place of the single output line 52 in FIG. 2.

Other prior art approaches to combating the noise sensitivity problem require signal processing or filtering of the output of the affected circuit, which can be very complicated and costly.

U.S. Pat. No. 4,630,104 of Nakagaki et al for "Circuit Arrangement for Removing Noise of a Color Video Signal" describes apparatus for color video signal processing to separate noise in a color video signal from the output, then subtract it from the color video signal output. This reference is not directed to solving the problem of power supply noise. A luminance signal and a chroma signal of a color video signal are processed to generate a first signal and a second signal, respectively. The first signal indicates the contour line of images represented by the video signal. The second signal includes noise included in the chroma signal and a signal component having an amplitude substantially equal to the peak to peak value of the noise. The first and second signals are fed to either a switching circuit or a multiplier so that a resultant output signal having only the noise is obtained. The noise components are then subtracted, by way of a subtractor, from the chroma signal so that a chroma signal having no noise will be obtained.

U.S. Pat. No. 4,475,215 of Gutleber entitled "Pulse Interference Cancelling System for Spread Spectrum Signals Utilizing Active Coherent Detection" describes a pulse interference canceling system for spread spectrum signals utilized in a digital noise coded communications system. A noise coded signal that is phase shifted by 180° is added to the original to cancel noise and to recover the coded signal. The system includes first and second noise coded signal channels located in a noise coded signal receiver which also includes a demultiplexer for providing a pair of received noise coded signals which were initially generated, multiplexed and transmitted to the receiver. First and second coherent detectors are coupled to both signal channels, the first being directly coupled thereto so that no signal delay exists. The second is coupled to the two signal channels with respective first and second variable time delay circuits having a delay substantially equal to the bit width of each digital code as well as a vernier delay which is adapted to delay the phase of any received pulse interference in the respective channel so that it is exactly 180° out of phase with the same undelayed pulse interference. Signal summing means are coupled to the outputs of the two coherent detectors which operate to completely cancel the interference pulse signal while leaving the desired noise coded signal at its peak amplitude.

U.S. Pat. No. 6,052,420 of Yeap et al. entitled "Adaptive Multiple Sub-band Common-mode RFI Suppression" uses a common mode signal to estimate noise in narrow frequency band. The estimate is subtracted from the original signal. A noise suppression circuit for a two wire communications channel comprising a hybrid device, e.g. a hybrid transformer or circuit, which provides a differential mode signal corresponding to a differential signal received from the channel. A summing device extracts from the channel wires a common mode signal that it supplies to a noise estimation unit that derives a common mode signal as an estimate of a noise level in a frequency band having a bandwidth narrower than an operating channel bandwidth. The noise estimation unit adjusts the amplitude of the noise estimate to correspond to the residual noise in the differential mode signal and subtracts it from the differential mode signal to produce a noise-suppressed output signal. A noise detection and control unit scans the operating band, identifies a frequency band having a highest noise level, and sets the noise estimation unit to the detected noisy band. The noise estimation unit suppresses the noise in that band. Preferably, the noise estimation unit comprises several channels, with a tunable filter, a phase shifter and an amplifier, and the noise detection and control unit sets the channels, in succession, to different frequency bands in descending order of noise level. The noise detection and control unit may cross-correlate the common mode signal and the noise-suppressed output signal and adjust the amplification of the noise estimation signal to reduce residual differential mode noise towards zero.

U.S. Pat. No. 6,061,456 of Andrea entitled "Noise Cancellation Apparatus" discloses a transducer for an acoustic noise cancellation apparatus for reducing background noise using microphones and amplifiers. The transducer includes a housing with first microphone for receiving a first acoustic sound, composed mainly of speech and background noise, that converts the first acoustic sound to a first signal. A second microphone is arranged at an angle, close to the first microphone to receive a second acoustic sound, composed mainly of the background noise, that converts the second acoustic sound to a second signal. The first and second microphones are connected to a differential amplifier of the noise cancellation apparatus to obtain a signal mainly representing speech. The amplifier is receives acoustic sounds from each microphone and has a first terminal and a second terminal. The second terminal is grounded. The transducer receives and amplifies an AC signal representative of the audio input from each microphone; and filters out the amplified AC signal from the DC signal. The DC signal powers the amplifier. A method for calibrating an active noise reduction apparatus includes use of a housing having a speaker to produce an acoustic anti-noise signal in the housing. A microphone detects an external noise signal, and amplitude adjustment calibrates the acoustic anti-noise signal creating a quiet zone in the housing for operation with an independent electrical assembly. The apparatus is calibrated separately from the electrical assembly. The method includes the steps of: inputting the external noise signal received by the microphone to produce an anti-noise signal. The anti-noise signal is transmitted to the speaker with an equal gain and an opposite phase response from the external noise signal detected by the microphone. The gain and phase response of the anti-noise signal are balanced by the amplitude adjustment located in the noise reduction apparatus to match the gain and phase response of the external noise signal to yield a theoretical zero in the quiet zone.

U.S. Pat. No. 5,907,624 of Taxidea entitled "Noise Canceler Capable of Switching Noise Canceling Characteristics" describes an acoustic noise canceler which switches noise canceling characteristic on detecting narrow band noise, and which cancels narrow band noise adequately. The noise canceler selects an output signal with a particular noise canceling characteristic, depending on whether or not a speech signal contained in an input acoustic signal is voiced. Also, the noise canceler adaptively changes, for an acoustic signal containing voiced sound, a window function that regulates the depth of a valley of an attenuation characteristic meant for the acoustic signal. The noise canceler improves an output signal with respect to the auditory sense and sound quality without regard to narrow band noise.

SUMMARY OF THE INVENTION

It is an object of this invention to diminish the effects of noise within a certain bandwidth by converting the noise to a control current that is fed into the affected circuit with an opposite polarity from the polarity of the noise.

In accordance with this invention, apparatus for compensating for power supply noise comprises a noise compensation amplifier with a power supply input for connection to a power supply. The amplifier provides an instantaneous amplified signal in response to power supply noise with an opposite polarity from the power supply noise. The noise compensation amplifier provides the noise sensitive circuit with a compensated power supply signal which enables it to produce a reduction in the amplitude of the noise signal at the output thereof.

Preferably, the amplifier includes a differential pair of coupled transistor circuits including a leading transistor circuit and a lagging transistor circuit.

Preferably, the leading and lagging transistor circuits have source-drain circuits connected in parallel to the source-drain circuit of a constant current transistor, whereby the leading and lagging transistor circuits share a common current as a function of voltages on the leading node connected to the gate of the leading transistor and a lagging node connected to the gate of the lagging transistor.

Preferably, the differential pair of coupled transistor circuits each have the source/drain circuits thereof connected in series with a transistor source/drain circuit connected to the power supply input; or the differential pair of coupled transistor circuits each have the source/drain circuit thereof connected in series with a resistor connected to the power supply input.

Preferably the amplifier includes a differential pair of coupled transistor circuits including a leading transistor circuit and a lagging transistor circuit the leading transistor circuit includes a first FET transistor having leading node connected to both and the gate electrode thereof and a resistive circuit, and the lagging transistor circuit includes and a lagging FET transistor having a lagging node connected to both the gate electrode thereof and the resistive and capacitive elements.

In accordance with another aspect of this invention, apparatus for compensating for power supply noise comprises a noise compensation amplifier with a power supply input and a reference potential input for connection to a power supply. The amplifier includes a differential amplifier circuit for providing an instantaneous amplified signal in response to power supply noise, and the amplifier produces an output signal with an instantaneous opposite polarity from the power supply noise. Thus, a noise sensitive circuit connected to the noise compensation amplifier has a compensated power supply signal which enables it to produce a reduction in the amplitude of the noise signal at the output thereof.

Preferably, the differential pair of coupled transistor circuits each have the source/drain circuits thereof connected in series with a transistor having the source/drain circuit thereof connected to the power supply input or the differential pair of coupled transistor circuits each have the source/drain circuit thereof connected in series with a resistor connected to the power supply input.

Preferably, and the differential amplifier circuit includes a differential pair of coupled transistor circuits including a leading transistor circuit and a lagging transistor circuit.

In accordance with still another aspect of this invention, apparatus for compensating for power supply noise comprises a noise compensation amplifier with a power supply input and a reference potential input for connection to a power supply. The amplifier includes a differential amplifier circuit for providing an instantaneous amplified signal in response to power supply noise. The amplifier produces an output signal with an instantaneous opposite polarity from the power supply noise. The differential amplifier circuit includes a differential pair of coupled transistor circuits including a leading transistor circuit and a lagging transistor circuit. The leading and lagging transistor circuits have source-drain circuits connected in parallel to the source-drain circuit of a constant current transistor. A current reference constant current source connected to a set of transistors with gate electrodes connected together and source/drain circuits connected to the ground with the gate electrodes connected to the source/drain circuit of one of the set of transistor to provide constant current in the source/drain circuits to the ground circuit. Thus the leading and lagging transistor circuits share a common current as a function of voltages on the leading node connected to the gate of the leading transistor and a lagging node connected to the gate of the lagging transistor and the noise sensitive circuit connected to the noise compensation amplifier has a compensated power supply signal which enables it to produce a reduction in the amplitude of the noise signal at the output thereof.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 4:
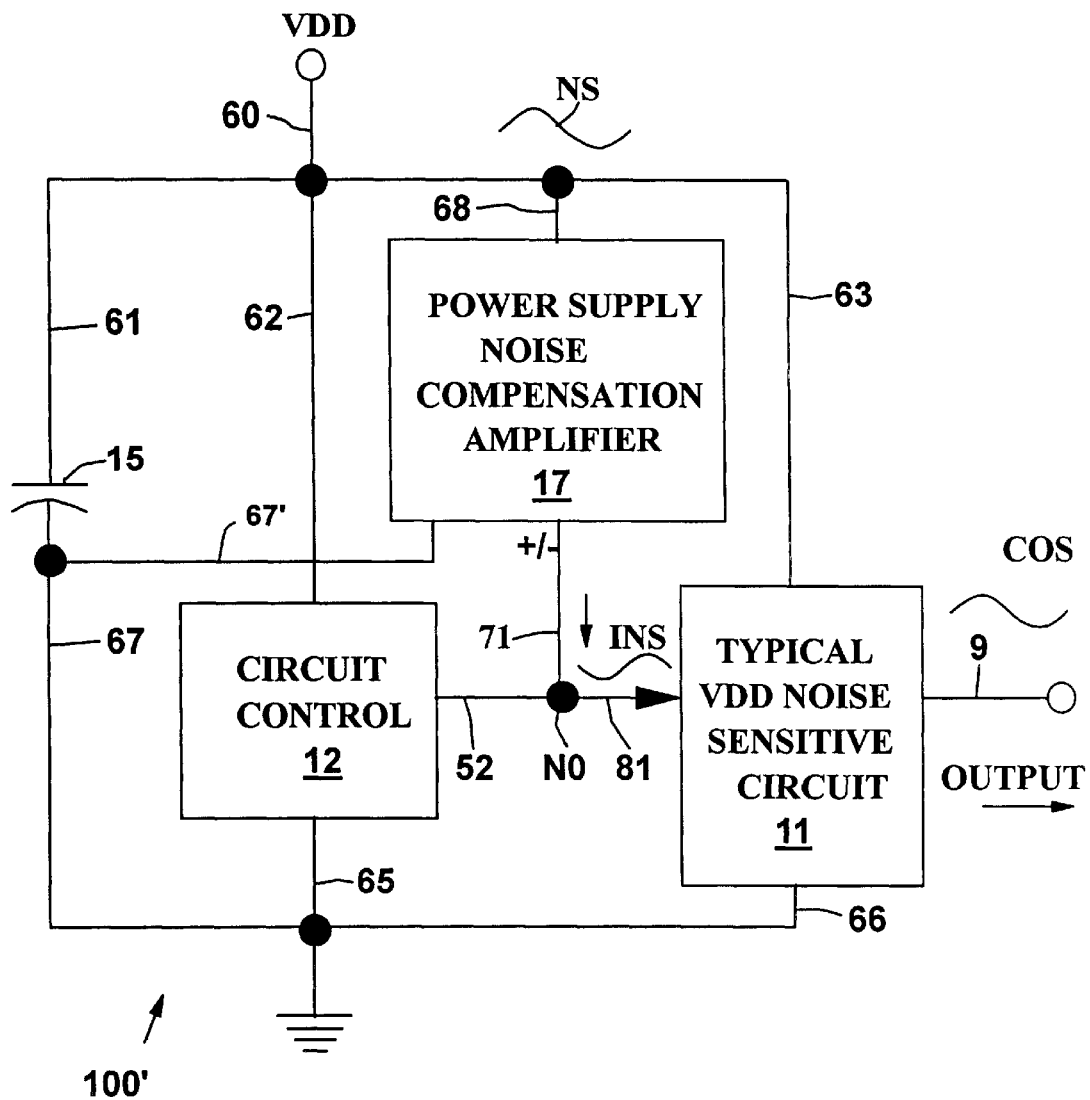
FIG. 4 is a schematic diagram which shows a first preferred embodiment of a Power Supply Noise Compensation (PSNC) amplifier in accordance with the present invention, wherein the system of FIG. 2 has been modified by the addition of the PSNC amplifier which provides a correction output current comprising an Inverted Noise Signal INS on a line which tends to compensate for the effect of the noise signal NS on the NSC.
Figure 5:
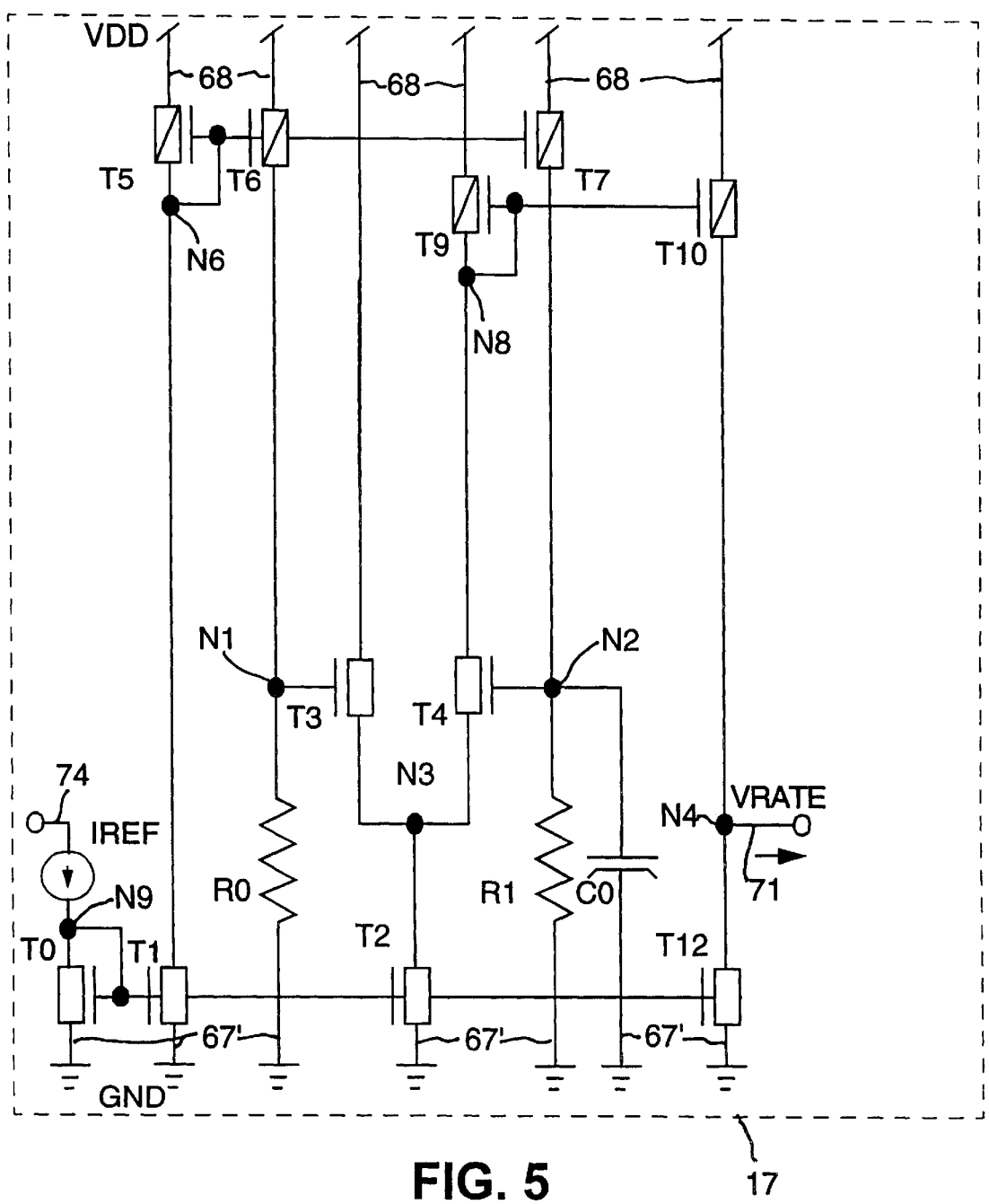
FIG. 5 is a circuit diagram of the single output line, variable current embodiment in accordance with this invention of the PSNC amplifier shown in FIG. 4. The power supply voltage VDD is used to supply power to the amplifier as seen in FIGS. 4/5. The PSNC amplifier detects the noise and provides a single compensating output current to the NSC.
Figure 6:
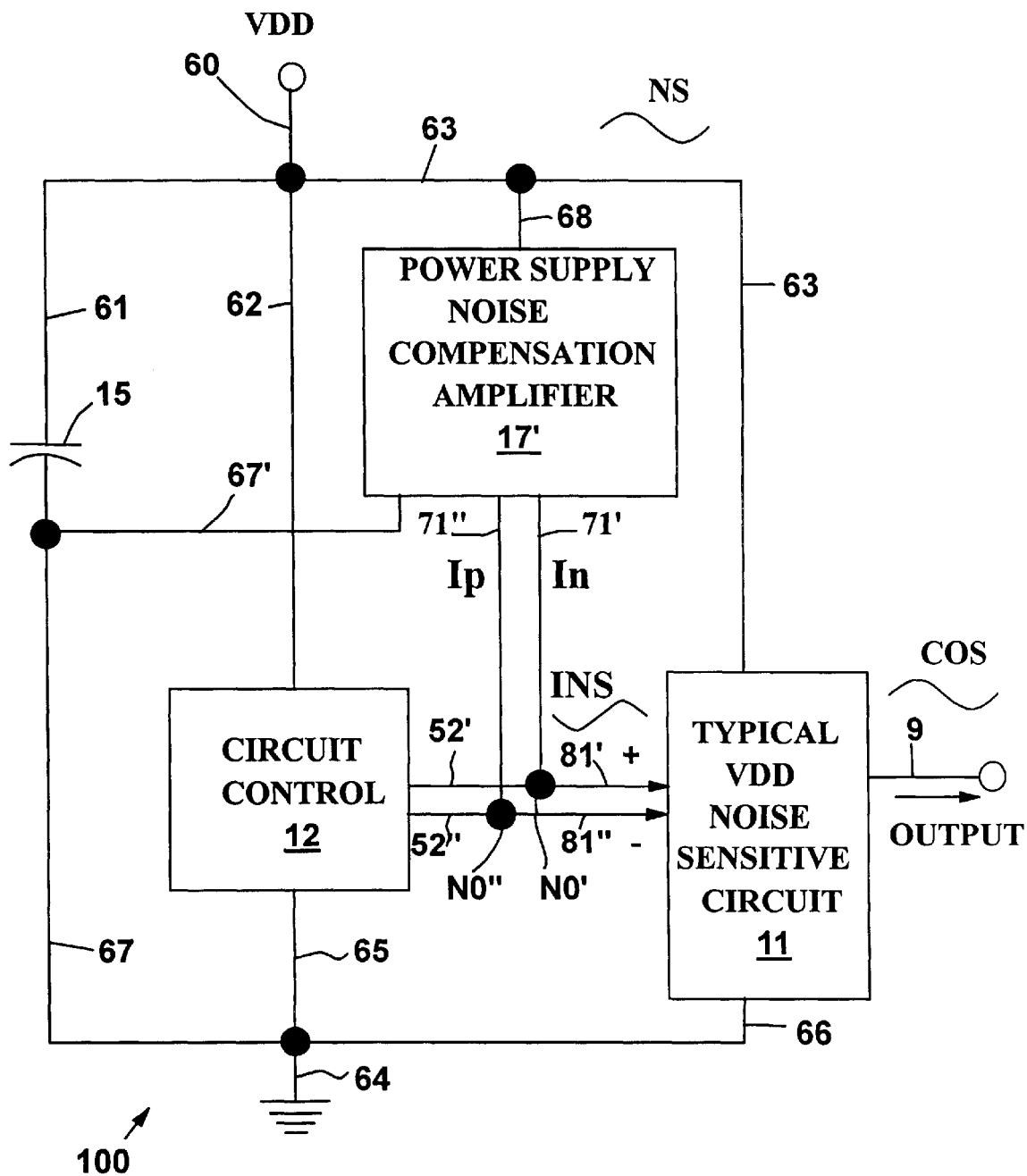
FIG. 6 is a schematic diagram which shows a first preferred embodiment of a Power Supply Noise Compensation (PSNC) amplifier in accordance with the present invention, wherein the system of FIG. 3 has been modified by the addition of the PSNC amplifier which provides a correction output current comprising an Inverted Noise Signal INS on a line which tends to compensate for the effect of the noise signal NS on the NSC.
Figure 7A:
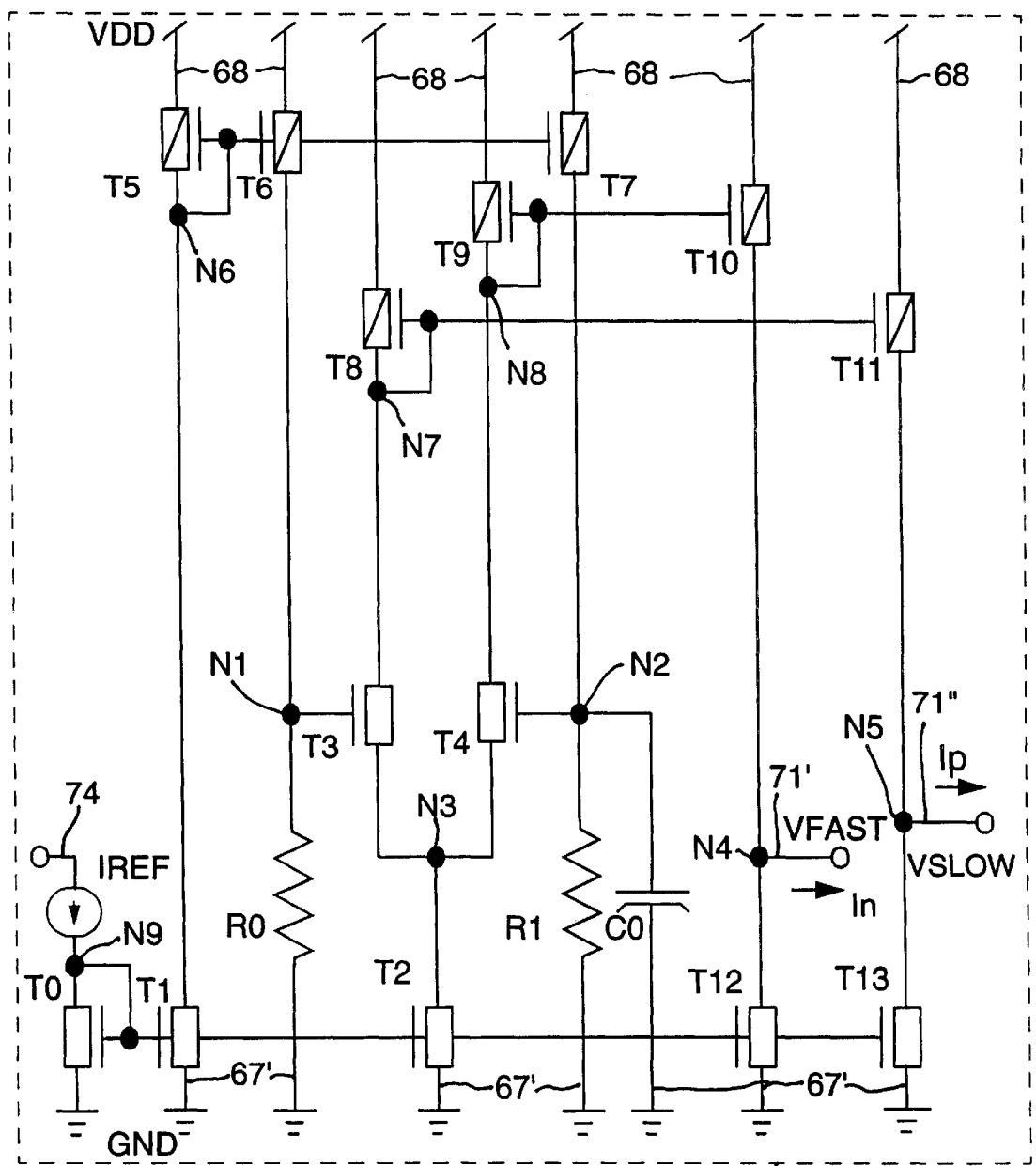
FIG. 7A is a circuit diagram of the single output line variable current embodiment in accordance with this invention of the PSNC amplifier shown in FIG. 6. The power supply voltage VDD is used to supply power to the amplifier as seen in FIGS. 6/7A. The PSNC amplifier detects the noise and provides a pair of compensating output currents to the NSC.
Figure 7B:
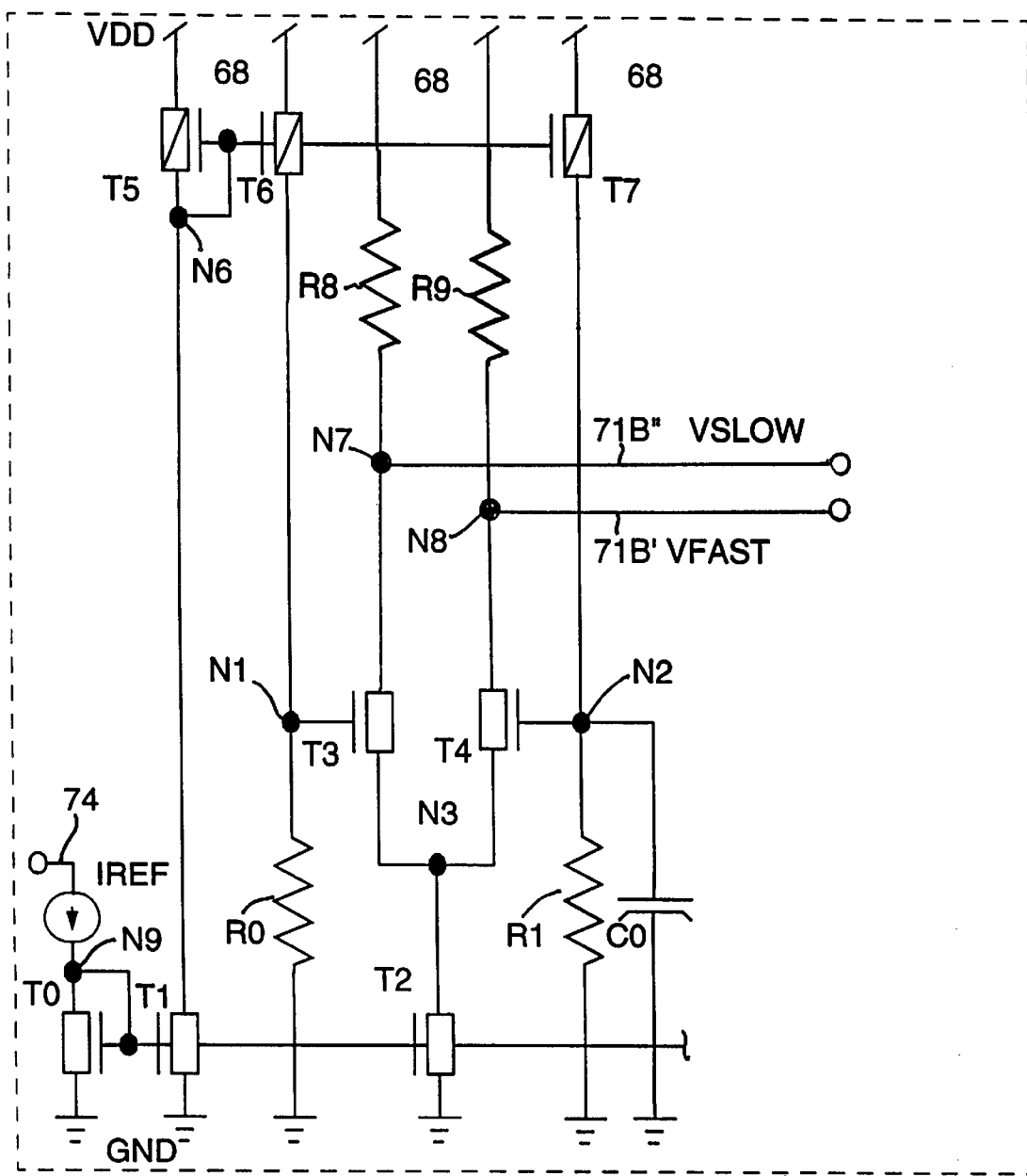
FIG. 7B is a circuit diagram of a single output line variable voltage embodiment in accordance with this invention of the PSNC amplifier shown in FIG. 6 which is an alternative to the embodiment shown in FIG. 7A.
Figure 8:
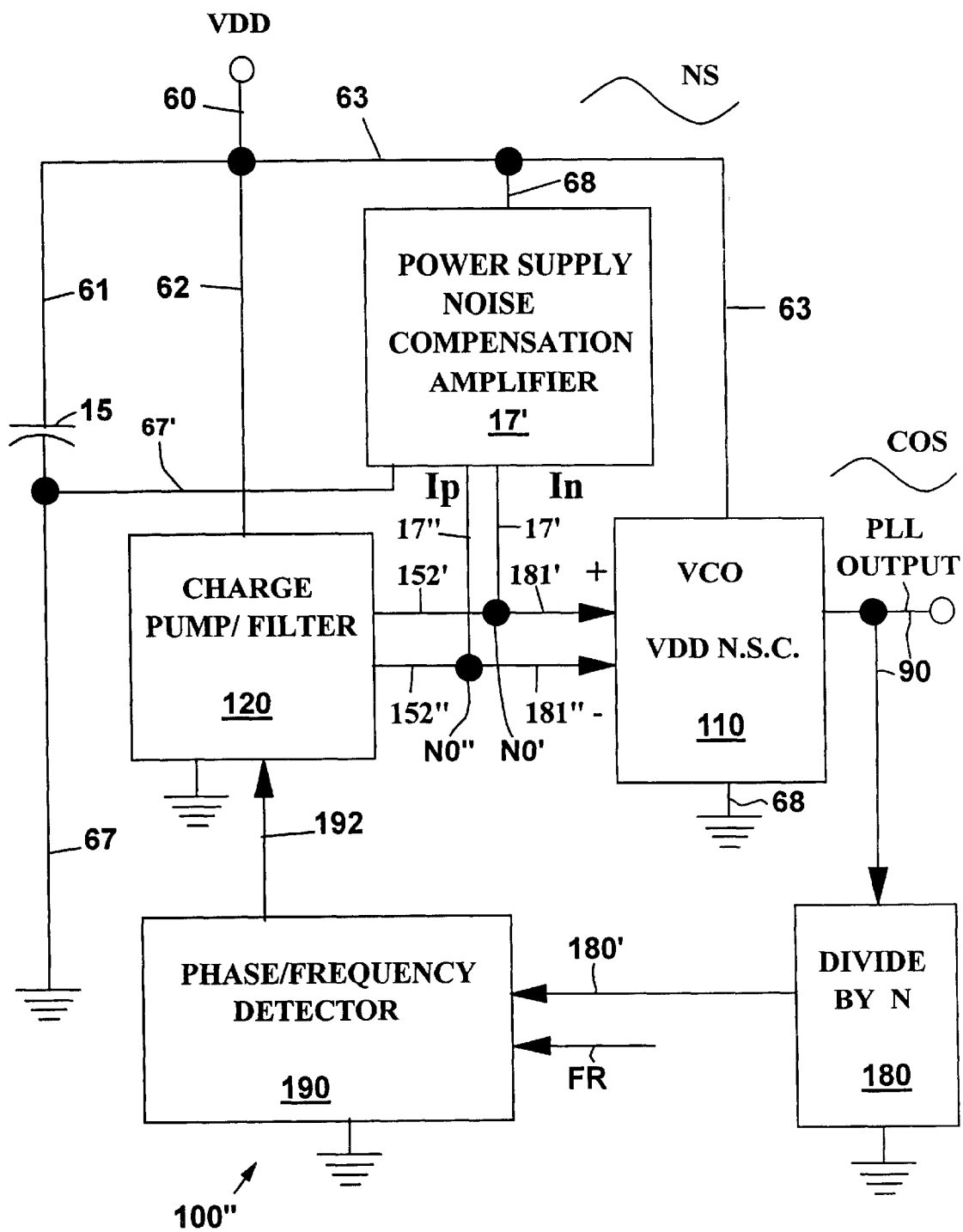
FIG. 8 shows an application of the embodiment of FIGS. 6 and 7A to a VCO circuit which includes a VCO_NSC with a phase locked loop output line in place of the NSC of FIG. 6.

The present invention employs a Power Supply Noise Compensation (PSNC) amplifier 17 seen in FIGS. 4 and 5 in a single output line embodiment of this invention and seen in FIGS. 6, 7A and 7B as a modified PSNC amplified 17' in a dual output line embodiment of this invention. In FIG. 8 the PSNC amplifier 17' of FIG. 7A is employed with a VCO loop circuit as the VDD NSC device 110. The amplifiers 17, 17' and 17' all provide output currents which compensate for noise on the power supply VDD as is explained in the descriptions found below.

In a particular application, this invention can be implemented where the noise sensitive circuit 11 comprises an I (current) Controlled Oscillator (ICO). Alternatively, it can be a Voltage Controlled Oscillator (VCO). Moreover this invention can be used to reduce the effects of noise in any circuit with variable controls. Use of an embodiment of this invention with an ICO/VCO is just one example of many possible applications therefor.

Single Output Line Embodiment

Figure 1:
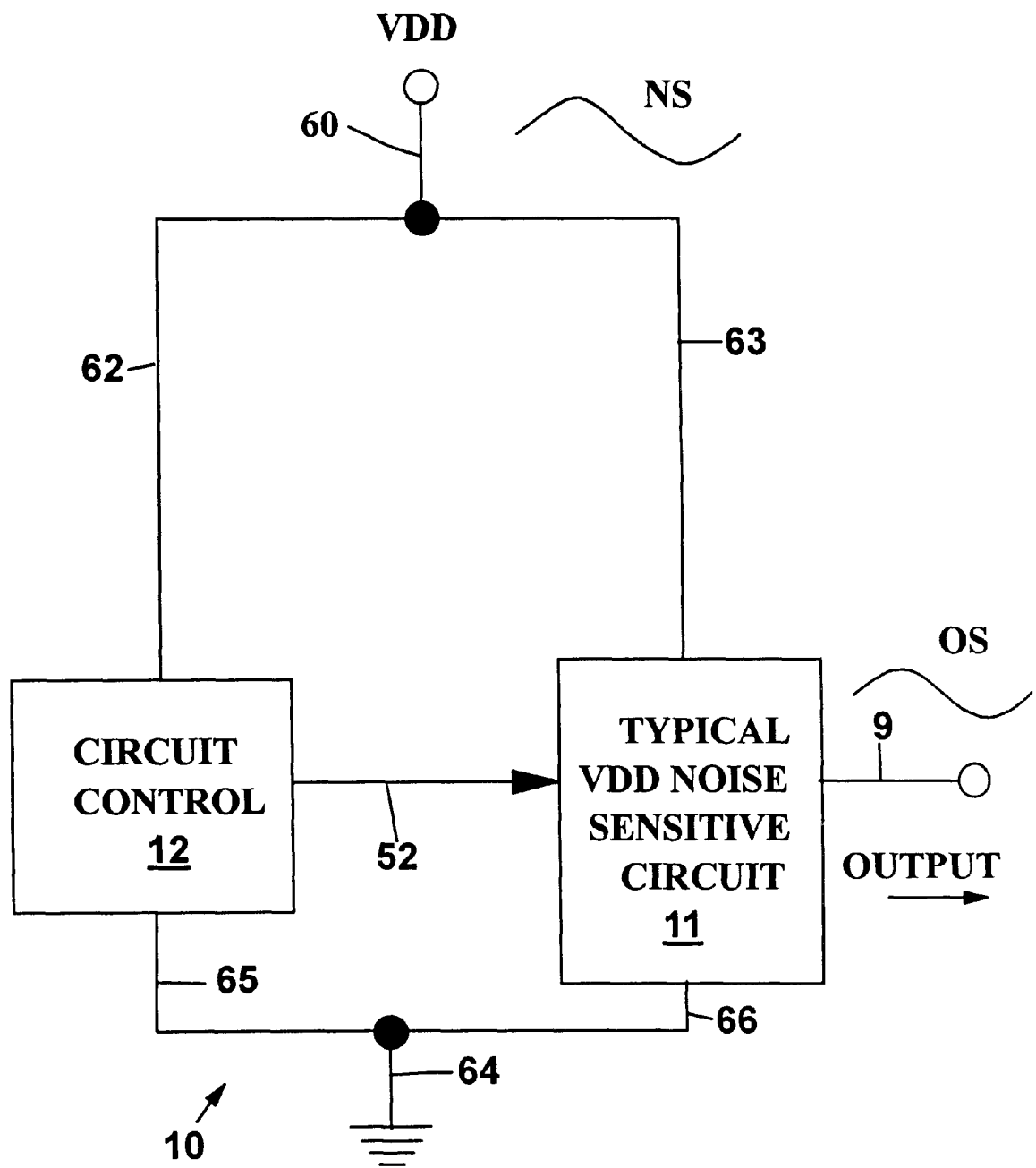
FIG. 1 shows a typical prior art system including a supply voltage VDD input connected to the power supply input of a typical VDD noise sensitive circuit.
Figure 2:
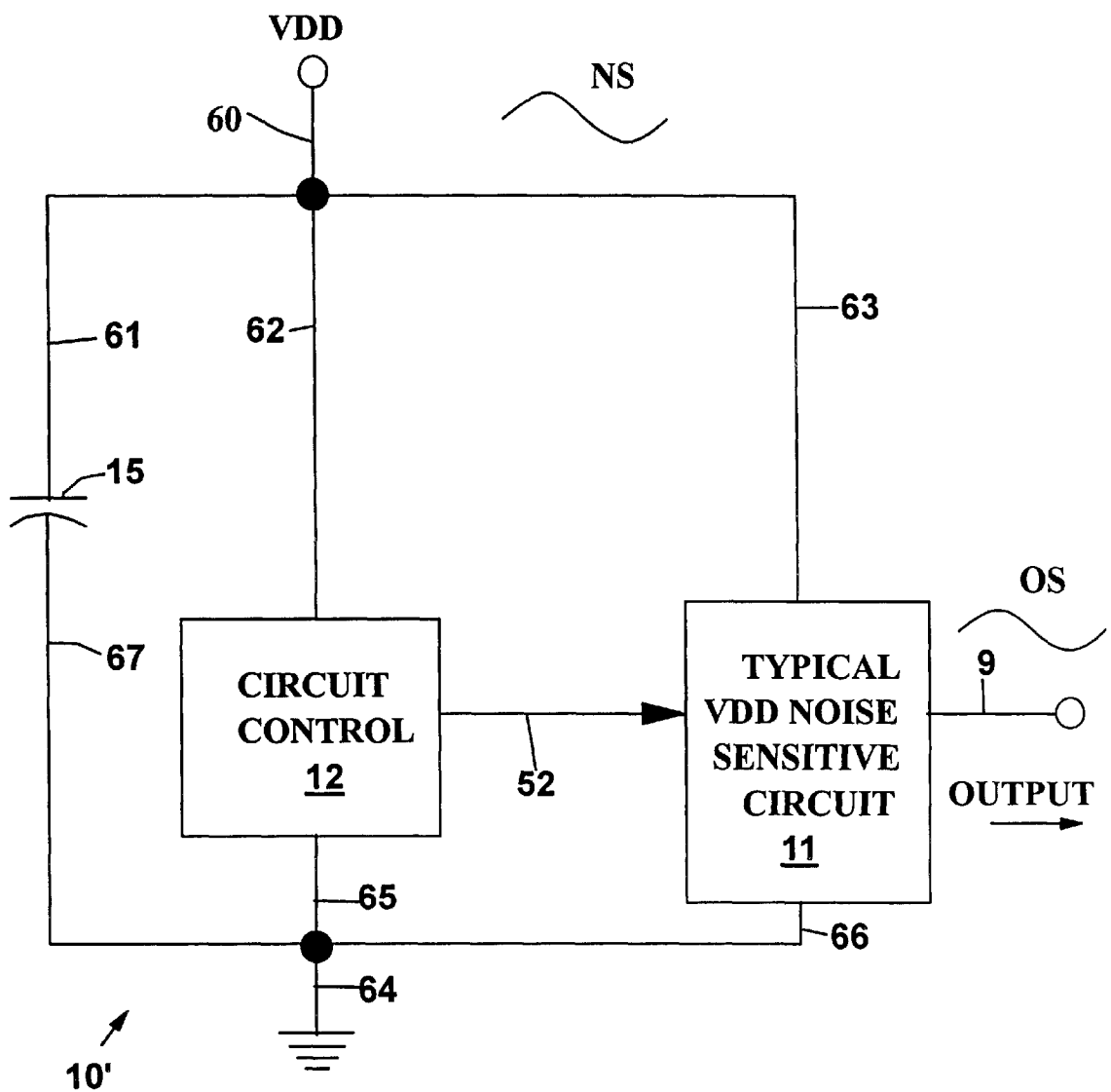
FIG. 2 is a modification of the electrical schematic diagram of FIG. 1 which shows a prior art method for combating the noise sensitivity problem by adding a decoupling capacitor across to the power supply to reduce the noise output signal on the output line.

FIG. 4 is a schematic diagram which shows a first preferred embodiment of a Power Supply Noise Compensation (PSNC) amplifier 17 in accordance with the present invention, wherein the system of FIG. 2 has been modified by the addition of the PSNC amplifier 17 which provides a correction output current comprising an Inverted Noise Signal INS on line 71 which tends to compensate for the effect of the noise signal NS on NSC 11.

In FIG. 4 like elements to those shown in FIG. 2 have the same description and serve the same function. The power input line 68 of the PSNC amplifier 17 is connected through line 63 and line 60 to the power output terminal of the power supply voltage VDD which includes the noise signal NS. A ground connection to the amplifier 17 is made through amplifier ground line 67' and the capacitor ground line 67 for connection to the power supply ground terminal.

The PSNC amplifier 17 provides the VRATE current through an output line 71 which supplies the INS plus/minus (+/−) compensation current (VRATE in FIG. 5). That is to say that the inverted noise frequency signal INS on line 71 is one hundred-eighty degrees (180°) out of phase with the noise signal NS on lines 60/62/63/68. At the node N0, the INS current on line 17 (from node N4 in FIG. 5) is added to the current on line 52 from the circuit control 12. The result is that a compensated input current is supplied on line 81 to the NSC 11. In other words, a noise compensated current which is the sum of the currents from line 52 and line 71 is supplied on the input line 81 to the NSC 11. The adjusted signals on line 81 provide plus/minus (+/−) adjustments to the current signals input to the noise sensitive circuit 11.

In the preferred embodiment of FIG. 4, the noise sensitive circuit 11 (not shown in FIG. 5) or another type of circuit which is in need of noise compensation, receives its control current on line 52 from control circuit 12 and on line 71 from amplifier 17 to compensate for fluctuations of the power supply voltage VDD, as described above.

Since the signal INS on line 71 is one hundred-eighty degrees (180°) out of phase with the noise signal NS reducing the effect of the noise signal on line 81 which is supplied to the noise sensitive circuit (NSC) 11, the result is a reduction of the noise in the compensated output signal COS on the output line 9.

For example, when circuit 17 senses an instantaneous noise induced decrease in the voltage VDD (on line 68 in FIG. 4), it responds by providing the correct current signal on line 71 in the case wherein the NSC 11 comprises an ICO/VCO circuit. A differential current produced by a reduced noise signal NS results in an increase in current on line 71. Likewise, a noise induced increase in the power supply voltage (VDD) or a noise induced decrease in the voltage on the ground (GND) increases the frequency of the NSC 11 and vice versa.

This invention reduces this effect of noise signals acting to modulate the frequency of the sensitive (ICO/VCO) circuit 11 by supplying currents INS in such plus/minus polarities as to reduce the ICO/VCO frequency when the source of noise is trying to increase it.

FIG. 5 is a circuit diagram of the single output line embodiment in accordance with this invention of the PSNC amplifier 17 shown in FIG. 4. The power supply voltage VDD is used to supply power to the amplifier 17 on line 68, as seen in FIGS. 4 and 5. The amplifier 17 detects the noise NS and provides a compensating output current on line 71.

The amplifier circuit of FIG. 5, includes a set of six MOS NFET transistors T0, T1, T2, T3, T4 and T12 and a set of five MOS PFET transistors T5, T6, T7, T9 and T10 plus two identical resistors R0 and R1 and a capacitor C0. The NFET input transistor T0 has its drain/source circuit connected between node N9 and line 67' to ground. Node N9 is connected through a constant current source IREF to line 74 and node N9 is also connected to the gate electrodes of transistors T0, T1, T2 and T12. The sources of PFET transistors T5, T6, T7, T9 and T10 and the drain of NFET transistor T3 are connected to voltage source VDD. The sources of some of the NFET transistors T0, T1, T2, and T12 are connected by line 67' to ground.

The drain of transistor T5 is connected through node N6 and through the source/drain of transistor T1 to ground. Node N6 connects to the gates of transistors T5, T6 and T7. The drain of transistor T6 is connected via leading node N1 through resistor R0 to ground. The leading node N1 also connects to the gate of transistor T3.

The drain of PFET transistor T7 is connected via the lagging node N2 through the parallel combination of resistor R1 and capacitor C0 to ground. The lagging node N2 also connects to the gate of transistor T4. The drain of PFET transistor T9 connects through node N8 to the drain of NFET transistor T4. Node N8 also connects to the gates of PFET transistors T9 and T10. The sources of NFET transistors T3 and T4 are connected via node N3 through the drain/source circuit of NFET constant current transistor T2 to ground. The drain of transistor T10 is connected via VRATE output node N4 through the drain/source circuit of transistor T12 to ground and as the output result of FIG. 5, node N4 provides the VRATE current output of circuit 17 on line 71 in FIG. 4.

Operation of Single Output Line Embodiment

The current from constant current reference IREF flows into node N9 which is connected to the source and gate of the reference FET transistor T0 which causes the transistor T0 to operate with a constant current maintaining a constant voltage at node N9 and on the gates of transistors T1, T2 and T12. The current IREF is mirrored by NFET transistor T1 and constant current NFET transistor T2. Current to NFET transistor T1 is supplied from PFET transistor T5 and mirrored to the identical pair of transistors, i.e. PFET transistor T6 and PFET transistor T7, which in turn supply currents to the two identical resistors, i.e. resistor R0 and resistor R1. An identical pair of transistors, i.e. NFET transistors T3/T4, comprise a source-coupled differential pair of transistors T3/T4 which pair senses and reacts to the difference in voltages between leading node N1 and lagging node N2. Constant current transistor T2 supplies the tail current for the source-coupled differential pair of transistors T3/T4.

When there is no noise on the VDD connection to sources of transistors T5, T6, T7, T9, and T10 (line 68 in FIG. 4) or GND sources of transistors T0, T1, T2 and T12 (line 67' in FIG. 4), the voltages at nodes N1 and N2 are identical. However, the presence of noise modulates the source/drain voltages of transistor T6 and transistor T7, changing their drain currents and causing the voltages at nodes N1 and N2 to change differentially because of capacitor C0. It should be noted that the voltages at leading node N1 and lagging node N2 would move identically, were it not for capacitor C0, which acts as a high pass filter, bypassing some of the noise current around resistor R1. Thus, the voltage on lagging node N2 changes less in response to noise, than leading node N1, and leading transistor T3 and lagging transistor T4 amplify a signal proportional to the power supply noise.

The current of NFET transistor T4 is mirrored to the output at node N4 by PFET transistor T9 and PFET transistor T10.

A noise signal that increases VDD will increase the voltage at leading node N1 relative to lagging node N2. In response, the differential pair of transistors T3/T4 will cause less current to flow in VRATE transistors T9/T10 thereby reducing the current flowing through node N4 to the line 71.

As a result, VRATE is decreased. The opposite effect occurs when the value of VDD decreases, thereby increasing VRATE. VRATE is connected to the noise affected circuit in such a way that the current change on line 71 is the opposite of the noise effect, thereby compensating for some of the noise.

The bandwidth over which this invention is effective is primarily determined by the values of resistor R1 and capacitor C0, as well as the bandwidth of the current mirror formed by PFET transistor T9/PFET transistor T10.

Dual Output Line Embodiment

Figure 3:
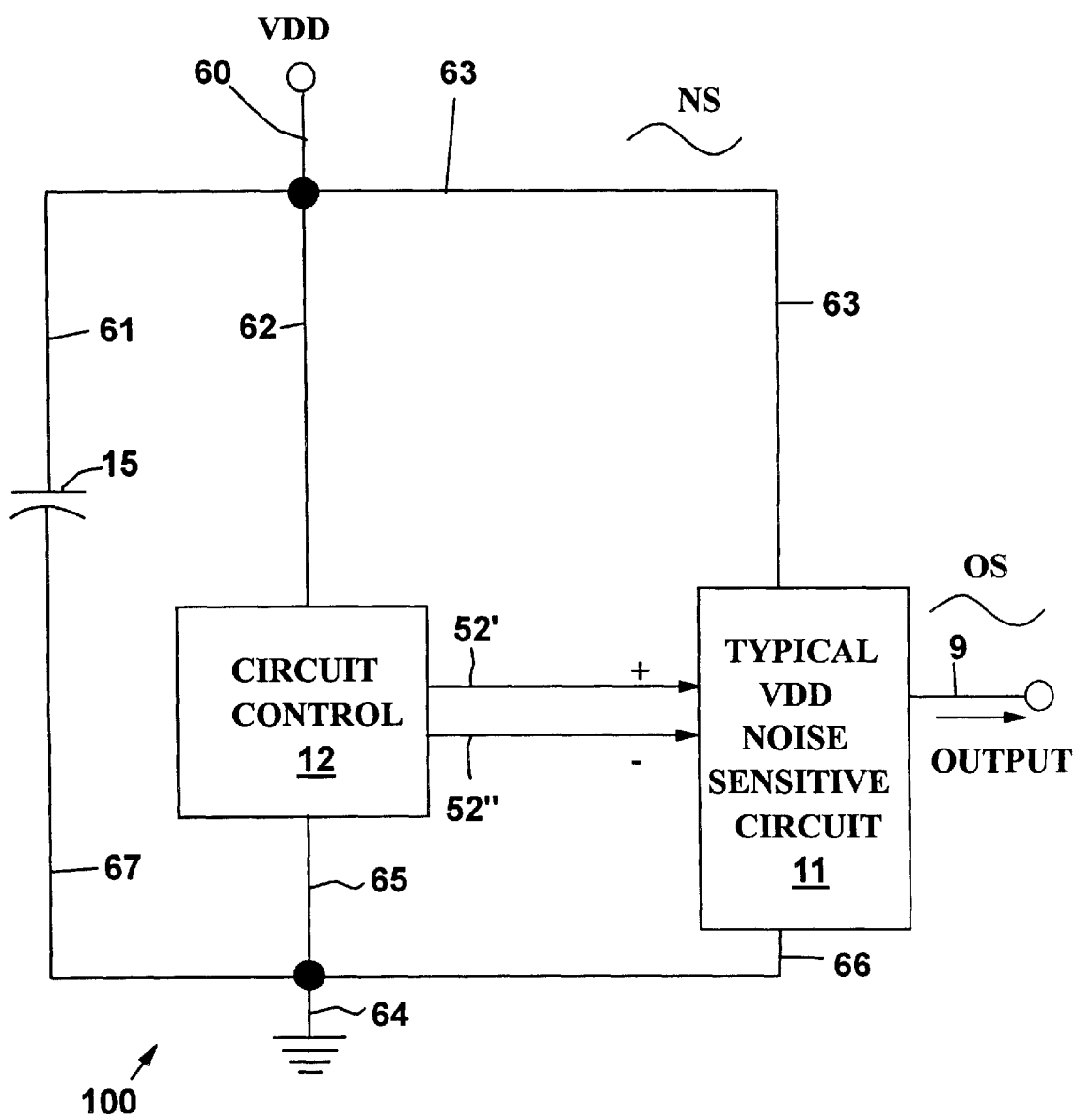
FIG. 3 is a modification of the electrical schematic diagram of FIG. 2 which shows a prior art method in which there are dual output lines in place of the single output line in FIG. 2.

In FIG. 6, a second preferred embodiment of the system of FIG. 3 has been modified by the addition of a PSNC amplifier 17' which is generally similar to the PSNC amplified 17 of FIGS. 4 and 5, but which has two output lines 71'/71" instead of the one line 71 in FIG. 4.

In the preferred embodiment, the NSC 11 of FIG. 6 is an ICO/VCO (such as the one shown in FIG. 8 or other circuit) which is in need of noise compensation, receives its control currents from output lines 71'/71" (terminals VFAST and VSLOW in FIG. 7A) to compensate for fluctuations of the power supply voltage VDD as described above. In the case of the NSC circuit 11 being an ICO/VCO, a differential current into VFAST and out of VSLOW increases the output frequency of the ICO/VCO circuit 11. Likewise, an increase in the power supply voltage (VDD) or a decrease in the ground (GND) increases the frequency of the ICO/VCO circuit 11 and vice versa.

The PSNC 17' has a power input line 68 connected to line 63 to line 60 to the power output terminal of the power supply voltage VDD. A return path ground connection of the amplifier 17 to the power supply is made via line 67' to line 67. The amplifier 17 has an output lines 71'/71" which supply a pair of inverted noise frequency INS signals In/Ip (one hundred-eighty degrees (180°) out of phase) to the output signals of the circuit control 12 on lines 52'/52" therefrom. The adjusted signals on lines 71'/71" provide plus/minus (+/−) adjustments to the signals on lines 52'/52" supplied to the two signal inputs 81'/81" of the NSC 11. The signals In/Ip are one hundred-eighty degrees (180°) out of phase with the noise signal NS. The result is a reduction of the noise in the compensated output signal COS on the output line 9.

This invention reduces this effect of noise signals NS acting to modulate the frequency of the ICO/VCO circuit 11 by supplying currents Ip/In on lines 71"/71' with appropriate polarities as to reduce the ICO/VCO frequency voltage when the power supply noise is trying to increase it and vice versa.

For example when circuit 17' senses an instantaneous noise induced decrease in the voltage VDD on power supply input line 68, it provides at its outputs the In/Ip signals on lines 71'/71" (VFAST/VSLOW in FIG. 7A) which change with an opposite polarity to the noise NS on line 68 from the power supply VDD. In the case wherein the NSC 11 comprises an ICO/VCO circuit, a differential current produced by a reduced noise signal NS results in a current increase at the VFAST terminal and a current decrease at the VSLOW terminal. Likewise, a noise induced increase in the power supply voltage (VDD) or a noise induced decrease in the voltage on the ground (GND) changes the current in the direction to increase the frequency of the NSC 11 and vice versa.

This invention reduces this effect of noise signals acting to modulate the frequency of the sensitive (ICO/VCO) NSC circuit 11 by supplying currents In and Ip with appropriate polarities for reducing the ICO/VCO frequency when the source of noise is trying to increase it.

The amplifier circuit of FIG. 7A, includes seven MOS NFET transistors T0, T1, T2, T3, T4, T12 and T13 and seven MOS PFET transistors T5, T6, T7, T8, T9, T10 and T11, plus two identical resistors R0 and R1 and capacitor C0. The NFET input transistor T0 has its drain/source circuit connected between node N9 and ground line 67'. Node N9 is connected through a constant current source IREF to line 74. Node N9 is also connected to the gate electrodes of transistors T0, T1, T2, T12 and T13. The sources of only five of the seven MOS transistors T0, T1, T2, T12 and T13 are connected to ground with the sources of NFET transistors T3 and T4 being connected to the drain of transistor T2.

The sources of all seven PFET transistors T5, T6, T7, T8, T9, T10 and T11 are connected to the voltage source VDD which is the source of the noise signal to be compensated by the amplifier 17'. The drain of transistor T5 is connected through node N6 and through the source/drain of transistor T1 to ground. Node N6 connects to the gates of transistors T5, T6 and T7.

The drain of transistor T6 is connected via leading node N1 through resistor R0 to ground. Leading node N1 also connects to the gate of transistor T3.

The drain of PFET transistor T7 is connected via lagging node N2 through the parallel combination of resistor R1 and capacitor C0 to ground. The lagging node N2 also connects to the gate of transistor T4.

The drain of PFET transistor T8 connects through node N7 to the drain of NFET transistor T3, and node N7 connects to the gates of PFET transistors T8/T11. The drain of PFET transistor T9 connects through node N8 to the drain of NFET transistor T4 and node N8 connects to the gates of PFET transistors T9/T10.

The sources of NFET transistors T3 and T4 are connected via node N3 through the drain/source circuit of NFET constant current transistor T2 to ground.

The drain of transistor T10 is connected via node N4 through the drain/source circuit of transistor T12 to ground. The drain of transistor T11 connects via node N5 through the source/drain circuit of transistor T13 to ground.

Node N4 provides the VFAST (In current) output of circuit 17. Node N5 provides the VSLOW (Ip current) output of circuit 17.

Operation of Dual Output Line Embodiment

The current from current reference IREF flows into node N9 which is connected to the source and gate of the reference FET transistor T0 which causes the transistor T0 to operate with a constant current maintaining a constant voltage at node N9 and on the gates of transistors T1, T2 and T12. The current IREF is mirrored by NFET transistor T1 and constant current NFET transistor T2.

The current IREF is mirrored by NFET transistor T1 and NFET constant current transistor T2. Current to NFET transistor T1 is supplied from PFET transistor T5 and mirrored to the identical pair of transistors, i.e. PFET transistor T6 and PFET transistor T7, which in turn supply currents to the two identical resistors, i.e. resistor R0 and resistor R1. An identical pair of transistors, i.e. NFET transistor T3 and NFET transistor T4, comprise a source-coupled differential pair. The source-coupled differential pair of NFET transistors T3/T4 senses the difference in voltage between leading node N1 and lagging node N2. Constant current transistor T2 supplies the tail current for the differential pair of NFET transistors T3/T4. Note that the tail current through transistor T2 is a constant current which must be shared by transistors T3 and T4. When there is no noise on VDD or GND, the voltages at the leading nodes N1 and the lagging node N2 connected to the gate electrodes of transistors T3 are identical.

The presence of noise modulates the source/drain voltages of PFET transistor T6 and PFET transistor T7, changing their drain currents and causing changes in the voltages at leading node N1 and lagging node N2.

The voltages at leading node N1 and lagging node N2 would move identically, were it not for capacitor C0, which acts as a high pass filter, bypassing some of the noise current around resistor R1 causing node N2 to lag behind leading node N1. Therefore, lagging node N2 voltage changes less than the voltage on the leading node N1. As a result, the leading circuit of transistor T3 and the lagging circuit of transistor T4 amplify a signal proportional to the noise on the power supply VDD.

The current of transistor T3 is mirrored to the output on VSLOW node N5 to output line 71" with current Ip by PFET transistor T8 and PFET transistor T11, while the current of transistor T4 is mirrored to the output on node N4 to output line 71' with current In by FET transistor T9 and FET transistor T10.

PFET transistor T8 and PFET transistor T9 are identical, as are PFET transistor T10 and PFET transistor T11. The currents of the identical NFET transistor T12 and NFET transistor T13 are mirrored from NFET transistor T0 in such a way that they balance the currents from transistor T10 and transistor T11 when there is no noise.

A noise signal that increases VDD will increase the voltage at node N1 relative to node N2. As a result, the source-coupled, differential pair of NFET transistors T3/T4 will cause more current to flow in VSLOW current mirror transistors T8/T11 than the VFAST current mirror transistors T9/T10.

As a result, Ip is increased and In is decreased.

VFAST and VSLOW are connected to the noise affected circuit in such a way that the change in Ip is the opposite of the noise effect, thereby compensating for some of the noise.

The bandwidth over which this invention is effective is primarily determined by the values of resistor R1 and capacitor C0, as well as the bandwidth of current mirrors transistor T8/T11 and transistor T9/T10.

FIG. 7B is a circuit diagram of a single output line variable voltage embodiment in accordance with this invention of the PSNC amplifier shown in FIG. 6 which is an alternative to the embodiment shown in FIG. 7A. In FIG. 7B, the difference in the circuit is that the transistor T8 has been replaced by resistor R8 and transistor T9 has been replaced by resistor R9. Transistors T10, T11, T12 and T13 have been omitted along with nodes N4 and N5 and the interconnection lines to those elements. Node N7 between the resistor R8 and the drain of transistor T3 is the VFAST output on line 71B". Node N8 between the resistor R9 and the drain of transistor T4 is the VSLOW output on line 71B'. The IR current drop through resistors R8 and R9 has necessitated a reversal of the connections to node N7 and N8 as shown since the voltage drops at node N7 when the IR drop increases across the resistor R8 and vice versa for node N8 and resistor R9.

FIG. 8 shows an application of the embodiment of FIGS. 6 and 7A to a VCO circuit 100" which includes a VCO__NSC 110 with a phase locked loop output line 90 in place of the NSC 11 of FIG. 6. The circuit of FIG. 8 is generally similar to FIG. 6. The differences between FIGS. 6 and 8 will be described below and the since the remainder of features are the same, they will not be discussed further here. A charge pump/filter 120 is substituted for the circuit control 12 of FIG. 6 and lines 152'/152" replace lines 52'/52". Node N0' and line 181' replace of the node N0 and line 81'. Node N0" and line 181" replace the node N0 and line 81". The functions are the same. Lines 17' and 152' join at node N0' which feed into line 181' into the plus (+) terminal of the VCO NSC 110. Lines 17" and 152" join at node N0" which feed into line 181" into the minus (−) terminal of the VCO NSC 110.

A feedback loop from line 90 connects to the input of divide by N circuit 180 which provides an input on line 180' to a phase/frequency detector 190. The other input of detector 190 is frequency reference line FR. The detector 190 feeds an input on line 192 to the charge/pump filter 120. This completes the Phase-Locked Loop (PLL) of FIG. 8. The frequency of the VCO__NSC 110 is controlled by the PLL feedback circuit.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. Apparatus for compensating for power supply noise comprising:

a noise compensation amplifier with a power supply input for connection to a power supply, the amplifier providing an instantaneous amplified signal in response to power supply noise with an opposite polarity from the power supply noise, and the amplifier including a differential pair of coupled circuits including a leading circuit including a first resistive element, and lagging circuit including a second resistive element and a capacitive element with said capacitive element acting as a high pass filter, whereby a noise sensitive circuit connected to the noise compensation amplifier has compensated power supply signal which enables it to produce a reduction in the amplitude of the noise signal at the output thereof.

2. The apparatus of claim 1 wherein the amplifier includes a differential pair of coupled transistor circuits including a leading transistor circuit and a lagging transistor circuit each having the source/drain circuits thereof connected in series with a transistor source/drain circuit connected to the power supply input.

3. The apparatus of claim 1 wherein the amplifier includes a differential pair of coupled transistor circuits including a leading transistor circuit and a lagging transistor circuit each having the source/drain circuit thereof connected in series with a resistor connected to the power supply input.

4. The apparatus of claim 1 wherein the amplifier includes a differential pair of coupled transistor circuits including a leading transistor circuit and a lagging transistor circuit.

5. The apparatus of claim 4 wherein:

the leading and lagging transistor circuits have source-drain circuits connected in parallel to the source-drain circuit of a constant current transistor, whereby the leading and lagging transistor circuits share a common current as a function of voltages on the leading node connected to the gate of the leading transistor and a lagging node connected to the gate of the lagging transistor.

6. Apparatus for compensating for power supply noise comprising:

a noise compensation amplifier with a power supply input for connection to a power supply, the amplifier providing an instantaneous amplified signal in response to power supply noise with an opposite polarity from the power supply noise, the amplifier includes a differential pair of coupled transistor circuits including a leading transistor circuit and a lagging transistor circuit, the leading transistor circuit including a first resistive element and the lagging transistor circuit including a second resistive element and a capacitive element, the leading and lagging transistor circuits have source-drain circuits connected in parallel to the source-drain circuit of a constant current transistor, the amplifier includes a differential pair of coupled transistor circuits including a leading transistor circuit and a lagging transistor circuit, the leading transistor circuit includes a first FET transistor having leading node connected to both and the gate electrode thereof and a resistive circuit, and the lagging transistor circuit includes and a lagging FET transistor having a lagging node connected to both the gate electrode thereof and a resistive element and a capacitive element with said capacitive element acting as a high pass filter, whereby the leading and lagging transistor circuits share a common current as a function of voltages on the leading node connected to the gate of the leading transistor and a lagging node connected to the gate of the lagging transistor, and a noise sensitive circuit which is connected to the noise compensation amplifier has a compensated power supply signal which enables it to produce a reduction in the amplitude of the noise signal at the output thereof.

7. The apparatus of claim 5 wherein the differential pair of coupled transistor circuits each has the source/drain circuits thereof connected in series with a transistor source/drain circuit connected to the power supply input.

8. The apparatus of claim 5 wherein the differential pair of coupled transistor circuits each have the source/drain circuit thereof connected in series with a resistor connected to the power supply input.

9. Apparatus or compensating or power supply noise comprising:

a noise compensation amplifier with a power supply input and a reference potential input for connection to a power supply, the amplifier includes a differential amplifier circuit for providing an instantaneous amplified signal in response to power supply noise, the amplifier including a differential pair of coupled circuits including a leading circuit including a first resistive element, and a lagging circuit including a second resistive element and a capacitive element with said capacitive element acting as a high pass filter, and the amplifier produces an output signal with an instantaneous opposite polarity from the power supply noise, whereby a noise sensitive circuit connected to the noise compensation amplifier has a compensated power supply signal which enables it to produce a reduction in the amplitude of the noise signal at the output thereof.

10. The apparatus of claim 9 wherein the amplifier includes a differential pair of coupled transistor circuits including a leading transistor circuit and a lagging transistor circuit each having the source/drain circuits thereof connected in series with a transistor having the source/drain circuit thereof connected to the power supply input.

11. The apparatus of claim 9 wherein the amplifier includes a differential pair of coupled transistor circuits including a leading transistor circuit and a lagging transistor circuit each having the source/drain circuit thereof connected in series with a resistor connected to the power supply input.

12. The apparatus of claim 9 wherein the differential amplifier circuit includes a differential pair of coupled transistor circuits including a leading transistor circuit and a lagging transistor circuit.

13. The apparatus of claim 10 wherein:

the amplifier includes a differential amplifier circuit including a differential pair of coupled transistor circuits including a leading transistor circuit and a lagging transistor circuit, and the leading transistor circuit and the lagging transistor circuit have source-drain circuits connected in parallel to the source-drain circuit of a constant current transistor, whereby the leading and lagging transistor circuits share a common current as a function of voltages on the leading node connected to the gate of the leading transistor and a lagging node connected to the gate of the lagging transistor.

14. The apparatus of claim 12 wherein:

the leading transistor circuit includes a first FET transistor having leading node connected to both and the gate electrode thereof and a resistive circuit, the lagging transistor circuit includes a lagging FET transistor having a lagging node connected to both the gate electrode thereof and the resistive and capacitive elements, and the differential amplifier circuit includes a differential pair of coupled transistor circuits including leading transistor and lagging transistor circuits.

15. The apparatus of claim 12 wherein the differential pair of coupled transistor circuits each have the source/drain circuits thereof connected in series with a transistor source/drain circuit connected to the power supply input.

16. The apparatus of claim 12 wherein the differential pair of coupled transistor circuits each have the source/drain circuit thereof connected in series with a resistor connected to the power supply input.

17. The apparatus of claim 9 wherein:

the differential amplifier circuit includes a differential pair of coupled transistor circuits including a leading transistor circuit and a lagging transistor circuit, the leading and lugging transistor circuits have source-drain circuits connected in parallel to the source-drain circuit of a constant current transistor, a current reference constant current source connected to a set of transistors with gate electrodes connected together and source/drain circuits connected to the ground with the gate electrodes connected to the source/drain circuit of one of the set of transistor to provide constant current in the source/drain circuits to the ground circuit, whereby the leading and lagging transistor circuits share a common current as a function of voltages on the leading node connected to the gate of the leading transistor and a lagging node connected to the gate of the lagging transistor and the noise sensitive circuit connected to the noise compensation amplifier has a compensated power supply signal which enables it to produce a reduction in the amplitude of the noise signal at the output thereof.

18. The apparatus of claim 17 wherein:

the leading transistor circuit includes a first FET transistor having leading node connected to both and the gate electrode thereof and a resistive circuit, the lagging transistor circuit includes a lagging FET transistor having a lagging node connected to both the gate electrode thereof and the resistive and capacitive elements, and the differential amplifier circuit includes a differential pair of coupled transistor circuits including leading transistor and lagging transistor circuits.

19. The apparatus of claim 17 wherein the differential pair of coupled transistor circuits each have the source/drain circuits thereof connected in series with a transistor source/drain circuit connected to the power supply input.

20. The apparatus of claim 17 wherein the differential pair of coupled transistor circuits each have the source/drain circuit thereof connected in series with a resistor connected to the power supply input.

* * * * *